United States Patent
Chen et al.

(10) Patent No.: US 7,074,692 B2
(45) Date of Patent: Jul. 11, 2006

(54) METHOD FOR REDUCING A SHORT CHANNEL EFFECT FOR NMOS DEVICES IN SOI CIRCUITS

(75) Inventors: Hung-Wei Chen, Hsinchu (TW); Hsun-Chin Tsao, Hsinchu (TW); Kuang-Hsin Chen, Jhongli (TW); Di-Houng Lee, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 63 days.

(21) Appl. No.: 10/807,081

(22) Filed: Mar. 23, 2004

(65) Prior Publication Data

US 2005/0215017 A1    Sep. 29, 2005

(51) Int. Cl.
    *H01L 21/76* (2006.01)
(52) U.S. Cl. .................................... 438/440
(58) Field of Classification Search ............... 438/440
    See application file for complete search history.

(56) References Cited

U.S. PATENT DOCUMENTS

| 5,468,657 | A |   | 11/1995 | Hsu ......................... 437/24 |
| 5,656,537 | A |   | 8/1997  | Iwamatsu et al. ........... 438/402 |
| 5,910,672 | A |   | 6/1999  | Iwamatsu et al. ........... 257/347 |
| 6,323,106 | B1 | * | 11/2001 | Huang et al. ............... 438/433 |
| 6,410,938 | B1 |   | 6/2002  | Xiang ........................ 257/49 |
| 6,613,678 | B1 |   | 9/2003  | Sakaguchi et al. .......... 438/695 |
| 2002/0022308 | A1 | * | 2/2002 | Ahn et al. .................. 438/164 |
| 2003/0132428 | A1 | * | 7/2003 | Agarwal et al. ............... 257/1 |

\* cited by examiner

Primary Examiner—Asok Kumar Sarkar
(74) Attorney, Agent, or Firm—Haynes and Boone, LLP

(57) ABSTRACT

Methods of reducing a short channel phenomena for an NMOS device formed in an SOI layer, wherein the short channel phenomena is created by boron movement from a channel region to adjacent insulator regions, has been developed. A first embodiment of this invention entails the formation of a boron or nitrogen doped insulator layer located underlying the NMOS device. This is accomplished via formation of shallow trench openings in composite silicon nitride-silicon shapes, followed by lateral pull back of the silicon nitride shapes exposing portions of the top surface of the silicon shapes, followed by implantation of boron or nitrogen ions into portions of the insulator layer exposed in the STI openings and into portions of the insulator layer underlying exposed portions of the silicon shapes. A subsequent hydrogen anneal procedure finalizes the doped insulator layer which alleviates boron segregation from an overlying NMOS channel region. A second embodiment features the formation of a dielectric barrier layer on the surfaces of STI openings preventing boron from segregated to silicon oxide filled STI regions. A combination of both embodiments can be employed to reduce and prevent boron segregation to both underlying and adjacent insulator regions, thus reducing the risk of short channel phenomena.

29 Claims, 6 Drawing Sheets

METHOD FOR REDUCING A SHORT CHANNEL EFFECT FOR NMOS DEVICES IN SOI CIRCUITS

BACKGROUND OF THE INVENTION (1) Field of the Invention

The present invention relates to methods of fabricating semiconductor devices and more specifically to a method used to reduce a short channel effect resulting from segregation of boron into surrounding silicon oxide regions.

(2) Description of Prior Art

The ability to fabricate semiconductor devices in a silicon on insulator (SOI) layer has allowed specific performance degrading capacitances to be reduced. However the presence of an additional silicon oxide region, the insulator component of the SOI layer, presents another region in which boron can be removed from a device region, segregated to that silicon oxide area. Since boron is used for threshold adjustment of N channel metal oxide semiconductor (NMOS) devices the unwanted removal of boron from the channel region can result in unwanted reductions of NMOS threshold voltage. With decreasing channel length designs boron segregation, specifically at the perimeter of a narrow channel length NMOS device, can result in an unwanted short channel phenomena.

The present invention will describe methods of reducing the risk of a short channel phenomena with a first embodiment featuring creation of boron doped regions in silicon oxide regions located underlying the NMOS channel region, with the boron doped oxide region now satisfying the silicon oxide regions affinity for boron. A second embodiment will describe formation of barrier layers on surfaces of shallow trench isolation regions filled with silicon oxide regions, with the barrier layers preventing boron from being segregated from an adjacent NMOS channel region to adjacent silicon oxide region. Prior art such as Sakaguchi et al in U.S. Pat. No. 6,613,678 B1, Xiang in U.S. Pat. No. 6,410,938 B1, Iwamatu et al in U.S. Pat. No. 5,656,537, and Iwamatsu et al in U.S. Pat. No. 5,910,672, describe methods of forming devices in or on SOI layers. None of the above prior art however describe the methods employed in present invention in which silicon oxide affinity for boron is decreased, or wherein boron is blocked from reaching the silicon oxide regions, allowing the desired level of boron in the NMOS channel region, to remain undisturbed.

SUMMARY OF THE INVENTION

It is an object of this invention to reduce the level of boron segregation from an NMOS device in an SOI layer, to adjacent silicon oxide regions such as the underlying buried silicon oxide layer of the SOI layer, as well as to adjacent to silicon oxide filled shallow trench isolation region.

It is another object of this invention to reduce the level of boron segregation from an NMOS channel region to adjacent silicon oxide regions via formation of boron or nitrogen doped silicon oxide areas located in the underlying buried silicon oxide region of the SOI layer.

It is still another object of this invention to restrict movement of boron from an NMOS channel region into adjacent silicon oxide filled shallow trench isolation (STI) regions via formation of nitride containing insulator barrier layers formed on the exposed surfaces of the silicon oxide filled shallow trench isolation regions.

In accordance with the present invention methods of reducing the level of boron segregation or diffusion, from an NMOS channel region to adjacent silicon oxide regions, is described. After formation of a silicon on insulator (SOI) region and deposition of an overlying silicon nitride layer patterning procedures are employed to form STI openings in the silicon nitride and underlying silicon layers, also forming composite shapes on the underlying insulator component of the SOI region, a buried oxide region, with the composite shapes comprised of overlying silicon nitride shapes on underlying silicon shapes. A first embodiment of this invention features a lateral pullback of the silicon nitride followed by implantation of boron or nitrogen ions into first portions of buried oxide region not covered by the composite shapes, and into second portions of the buried oxide region implanted through portions of the silicon shape not covered by the silicon nitride shapes. A hydrogen anneal is next used to reduce damage incurred during the composite shape patterning procedure, in addition to activating the implanted ions forming a boron or nitrogen doped silicon oxide region in the buried oxide region. Silicon oxide filling of the spaces between the composite shapes and removal of the silicon nitride shapes result in silicon shapes on boron or nitrogen doped silicon oxide regions, available to accommodate an NMOS device. A second embodiment of this invention employed after formation of a boron doped silicon oxide, features formation of a silicon oxynitride or of a silicon nitride-silicon oxide liner on exposed surfaces of the STI openings as well as on the exposed top surface of the boron doped silicon oxide region. Again as was the case for the first embodiment silicon oxide filling of the spaces between the composite shapes and removal of the overlying silicon nitride shapes result in silicon shapes on boron doped silicon oxide regions, separated from filling silicon oxide layer by the liner layers.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
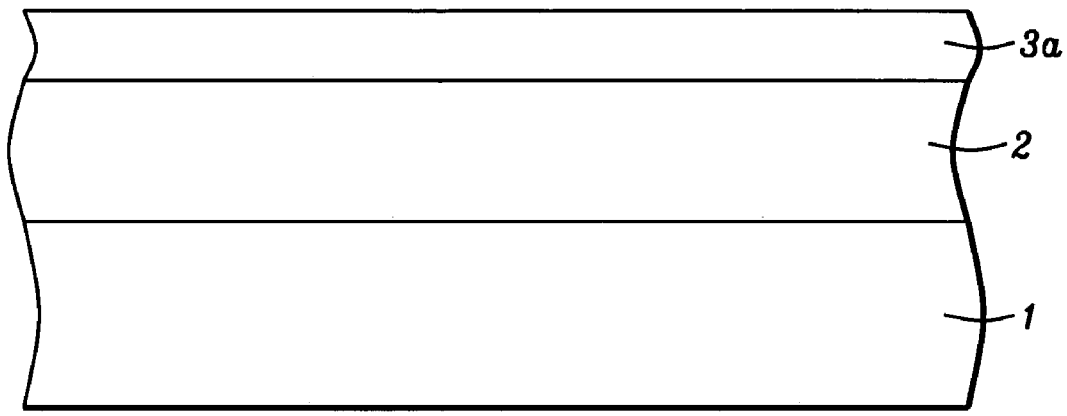
FIGS. 1–8, which schematically in cross-sectional style describe a first embodiment of this invention in which boron segregation from a NMOS channel region to adjacent silicon oxide regions is reduced via formation of a boron or nitrogen doped area formed in portions of a buried oxide region which is located underlying the silicon shape to be used to accommodate an NMOS device.

Methods used to reduce short channel phenomena by reducing boron segregation, and by blocking boron movement from an NMOS channel region to adjacent silicon oxide regions, will now be described in detail. Semiconductor substrate 1, comprised of single crystalline P type silicon, featuring a <100> crystalline orientation, is used and schematically shown in FIG. 1. Buried oxide layer 2, can be obtained via several procedures such as wafer bonding or implantation of oxygen ions through a top portion of the semiconductor substrate with a subsequent anneal procedure activating the implanted oxygen ions and forming buried oxide region 2, in an area underlying a top portion of semiconductor substrate 1. Another approach for obtaining buried oxide region 2, is to form the buried oxide layer on the top surface of a first semiconductor substrate followed by bonding of the first semiconductor substrate to a second semiconductor substrate. Mechanical removal of a top portion of the second semiconductor substrate results in a bottom, unremoved portion of the second semiconductor substrate providing silicon layer 3a, now located overlying buried oxide region 2, wherein the buried oxide region is comprised with a thickness between about 50 to 5000 Angstroms. The silicon on insulator (SOI) configuration is schematically shown in FIG. 1. The desired dopant concentration of silicon layer 3a, needed for a subsequent NMOS device is obtained via use of a second semiconductor substrate comprised with the desired P type dopant concentration, or obtained via P type ion implantation doping procedures applied to specific portions of the second semiconductor substrate or applied to the remaining bottom portion of the second semiconductor substrate after bonding and mechanical removal procedures.

Figure 2:
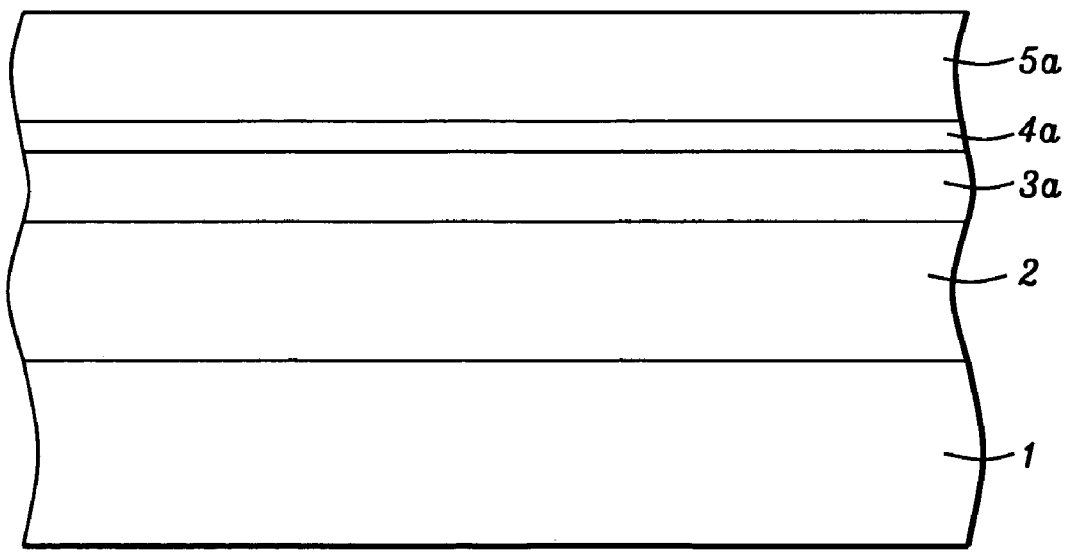

Silicon oxide pad layer 4a, is next formed on silicon layer 3a, at a thickness between about 10 to 200 Angstroms, via thermal oxidation, or via low pressure chemical vapor deposition (LPCVD), or via plasma enhanced chemical vapor deposition (PECVD) procedures. Silicon nitride layer 5a, is next deposited at a thickness between about 100 to 1500 Angstroms via LPCVD or PECVD procedures. The result of the formation of these insulator layers is schematically shown in FIG. 2.

Figure 3:
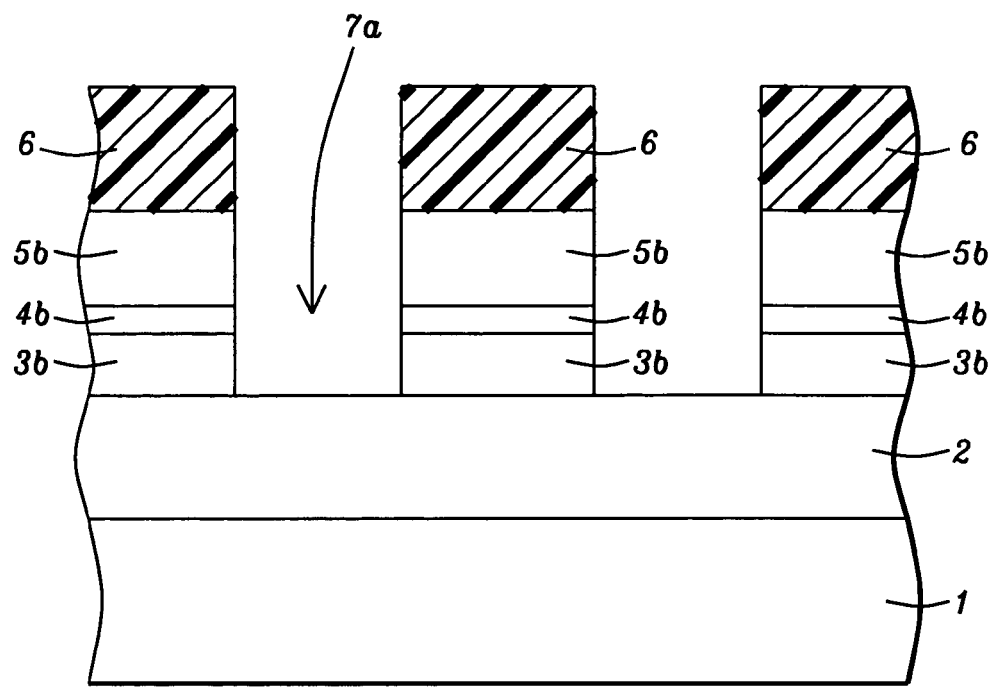
Figure 4:
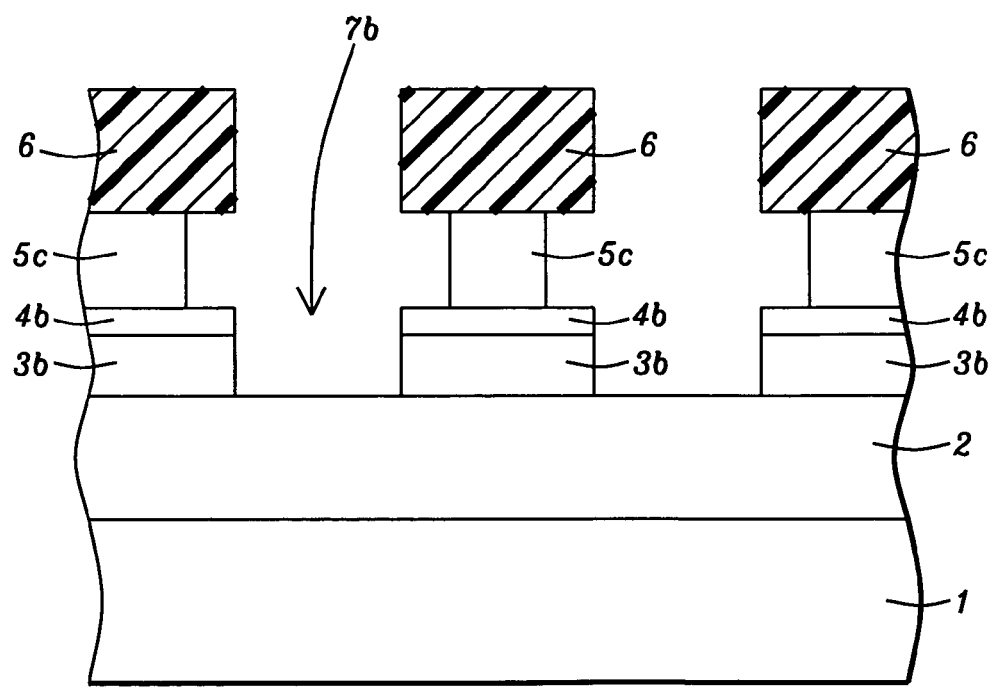

Photoresist shape 6, is next formed and used as an etch mask to allow an anisotropic reactive ion etch (RIE) procedure to define a composite stack on buried oxide layer 2, with the composite stack at a width between about 0.05 to 10 micrometers (um), and comprised of overlying silicon nitride shape 5c, silicon oxide shape 4b, and silicon shape 3b, and resulting in initial shallow trench isolation (STI) opening 7a. The anisotropic RIE procedure is performed to define a trench touching the top surface of buried oxide region 2. This is schematically shown in FIG. 3. With photoresist shape 6, still in place lateral pull back of silicon nitride shape 5b, is performed via a wet etch procedure performed using $H_3PO_4$ or $H_2PO_3$ as an etchant for silicon nitride. The amount of lateral pull back of silicon nitride is between about 10 to 500 Angstroms, resulting in narrower silicon nitride shape 5c, resulting in final STI opening 7b, schematically shown in FIG. 4.

Figure 5:
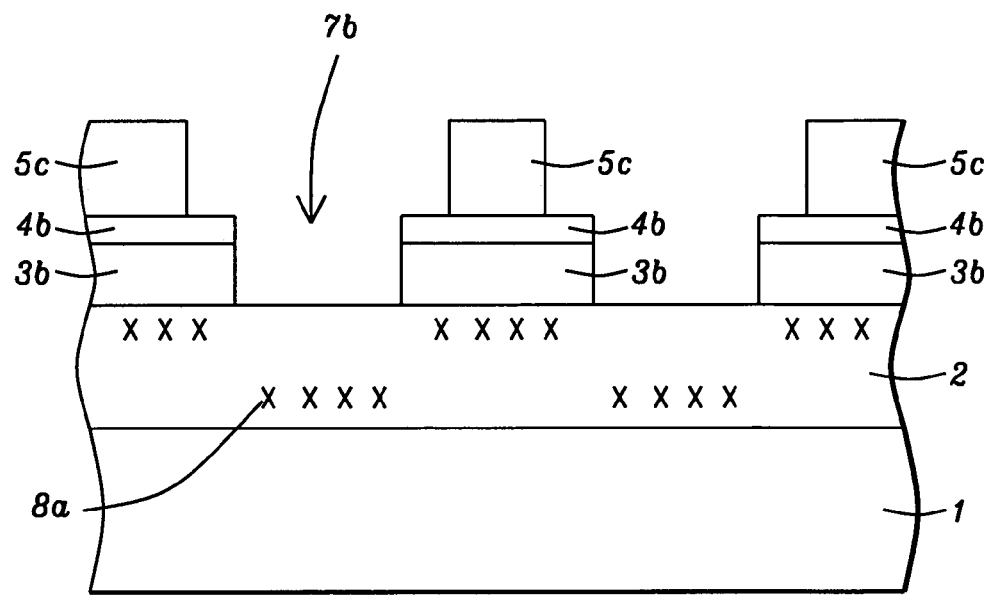

A first embodiment of this invention featuring implantation into portions of buried oxide region 2, for purposes of forming regions that will either satisfy buried oxide region 2, affinity for boron, or will create a region in buried oxide region 2, that will block boron movement from the NMOS channel region, will now be described. After removal of photoresist shape 6, via plasma oxygen ashing procedures an ion implantation procedure is performed featuring boron ions 8a, implanted at an energy between about 1 to 10 KeV, at a dose between about 1E12 to 1E16 atoms/cm$^2$, using an implant angle between about 0 to 45 degrees. The pull back of silicon nitride shape 3b, allows the implanted boron ions to reach a top portion of buried oxide region 2, in a region underlying the edges of silicon shapes 3b. The large implant angle also allows boron ions to placed in top portions of buried oxide region 2, located beyond the edges of silicon shapes 3b. In addition implanted boron ions are also located in portions of buried oxide region 2, not covered by the overlying composite stacks. This is schematically shown in FIG. 5.

Figure 6:
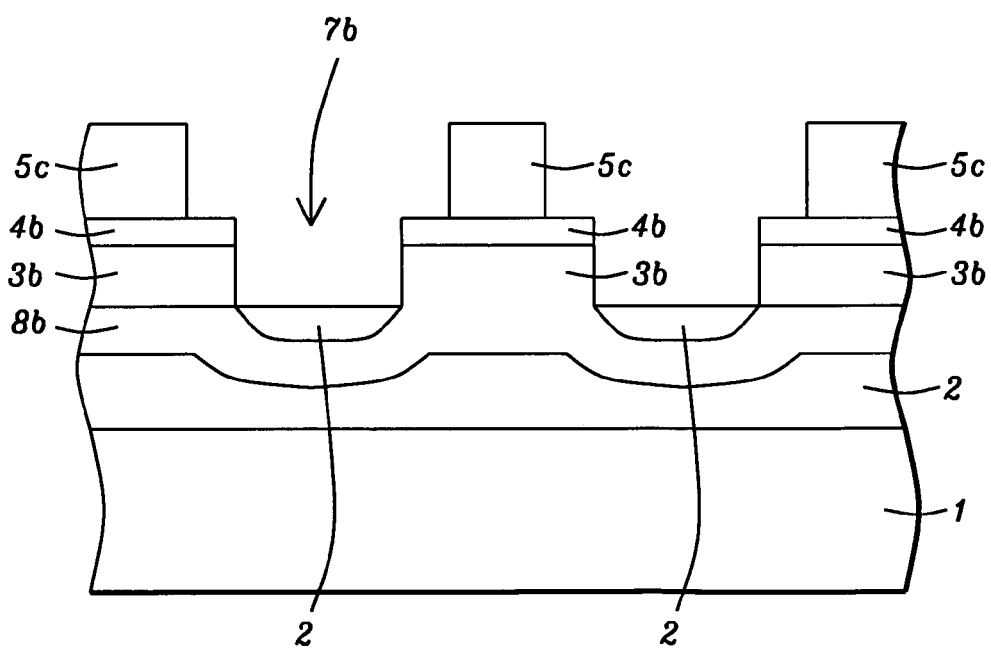

A hydrogen anneal procedure is next performed at a temperature between about 800 to 1100° C., for a time between about 10 sec to 15 min, at a pressure between about 10 to 1000 torr. The anneal procedure reduces damage in silicon shapes 3b, that may have occurred during the dry etching used to define the STI openings. The hydrogen anneal also activates boron ions 8a, forming boron doped silicon oxide region 8b, shown schematically in FIG. 6. A top portion of buried oxide region 2, exposed in STI region 7b, may not be converted to boron doped silicon oxide region 8b.

If desired a nitrogen implantation procedure can be performed in place of the boron implantation procedure. Implanted nitrogen ions are placed in identical locations as the previously described boron ions 8a, again via large angle implantation, as previously shown in FIG. 5. Subsequent hydrogen annealing results in a nitrogen doped silicon oxide region which will behave as a diffusion barrier for boron diffusion from the NMOS channel region, thus reducing the level of boron segregation and reducing short channel effects. In addition if desired the combination of boron and nitrogen implantation procedures can be applied to create a boron and nitrogen silicon oxide region now presenting both types of protection against boron segregation and movement from NMOS channel regions.

Figure 7:
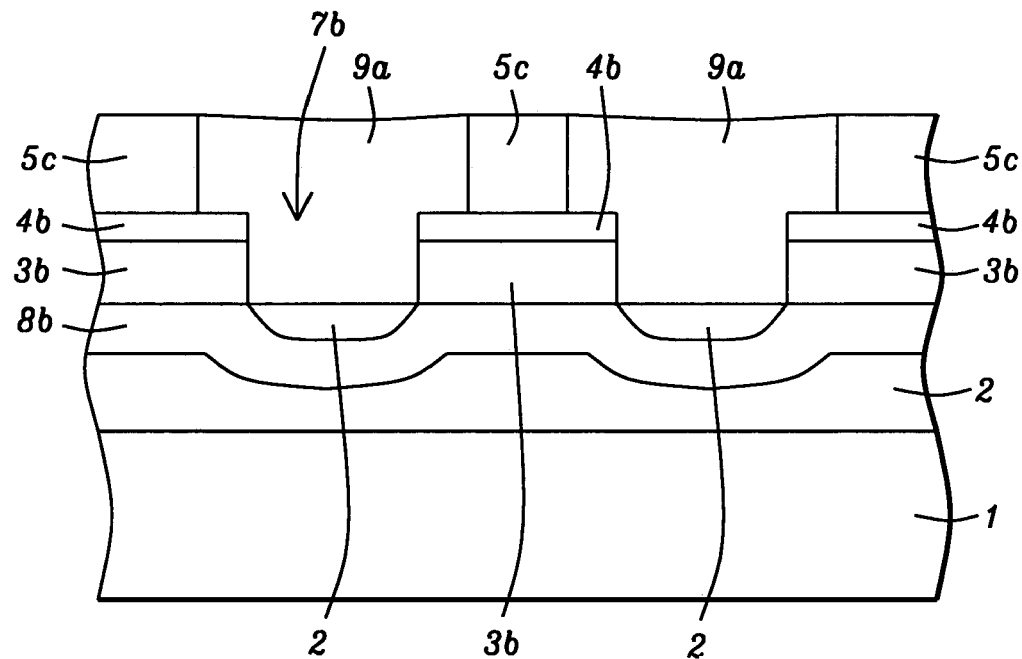
Figure 8:
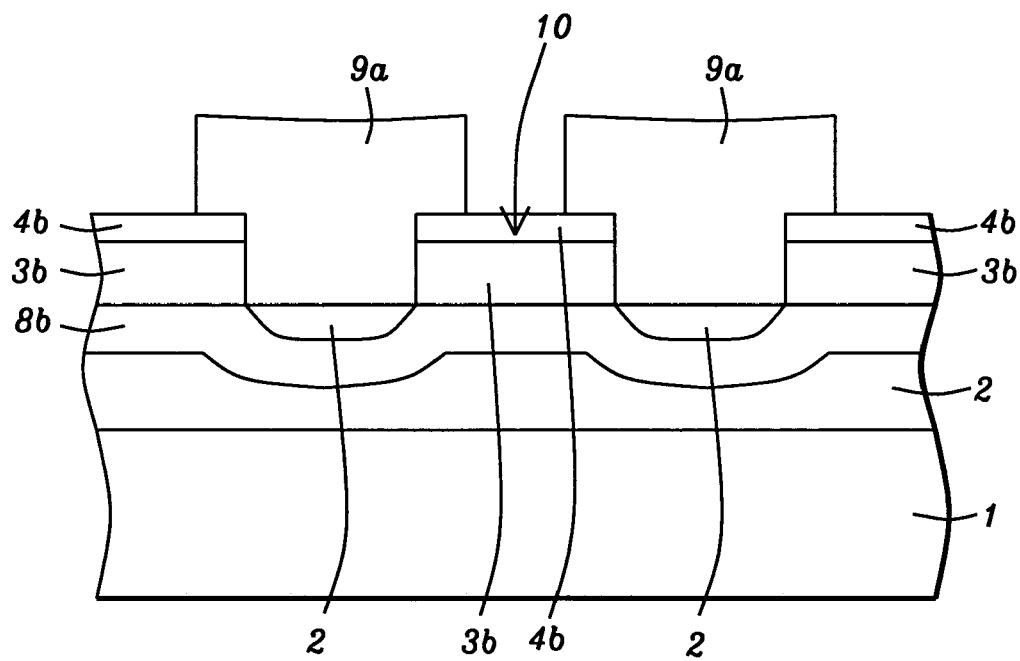

Filling of STI openings 7b, is next addressed and schematically described using FIGS. 7–8. Silicon oxide layer 9a, is deposited via LPCVD, PECVD, HDPCVD, or SACVD procedures, to a thickness between about 100 to 5000 Angstroms, completely filling STI openings 7b. A chemical mechanical polishing (CMP) procedure is next employed to selectively remove portions of silicon oxide layer 9a, from the top surface of silicon nitride shapes 5c, resulting in planarized insulator filled STI regions. This is schematically shown in FIG. 7. Removal of silicon nitride shapes 5c, is next accomplished via a selective wet etch procedure using a hot phosphoric acid solution, resulting in insulator filled STI regions 9b, schematically shown in FIG. 8. The wet etch procedure also results in some thinning of insulator filled STI regions 9a.

Figure 9:
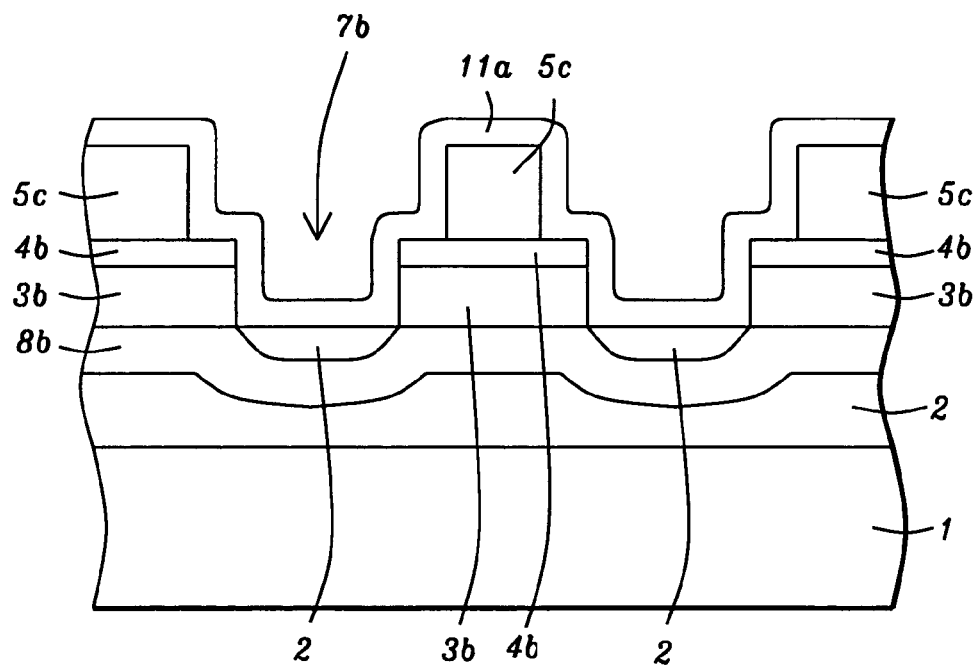
FIGS. 9–11, which schematically in cross-sectional style describes a second embodiment of this invention wherein boron movement from a NMOS channel region into adjacent silicon oxide regions is reduced via formation of a boron containing area formed in portions of a buried oxide region located underlying the silicon shape used to accommodate an NMOS device, and wherein boron movement is restricted from entering silicon oxide filled STI regions via formation of barrier liner layers on the surface of STI openings prior to silicon oxide filling.

A second embodiment of this invention in which reduction of boron segregation to buried oxide regions, as well as to adjacent insulator filled STI regions, is next described. After formation of boron or nitrogen doped buried oxide region 8b, a nitrogen containing liner 11a, a layer such as silicon oxynitride, is deposited via LPCVD, PECVD, or rapid thermal processing (RTP) procedures, at a thickness between about 10 to 100 Angstroms. If desired layer 11a, can also be a composite insulator layer comprised of an underlying silicon oxide layer obtained at a thickness between about 10 to 100 Angstroms via thermal oxidation using a furnace or an RTP system, or obtained via LPCVD or PECVD procedures, and comprised with an overlying silicon nitride layer obtained via LPCVD, PECVD, or RTCVD procedures at a thickness between about 10 to 100 Angstroms. Silicon oxynitride, or composite insulator layer 11a, completely lines all exposed surfaces of STI openings 7b. This is schematically shown in FIG. 9.

Figure 10:
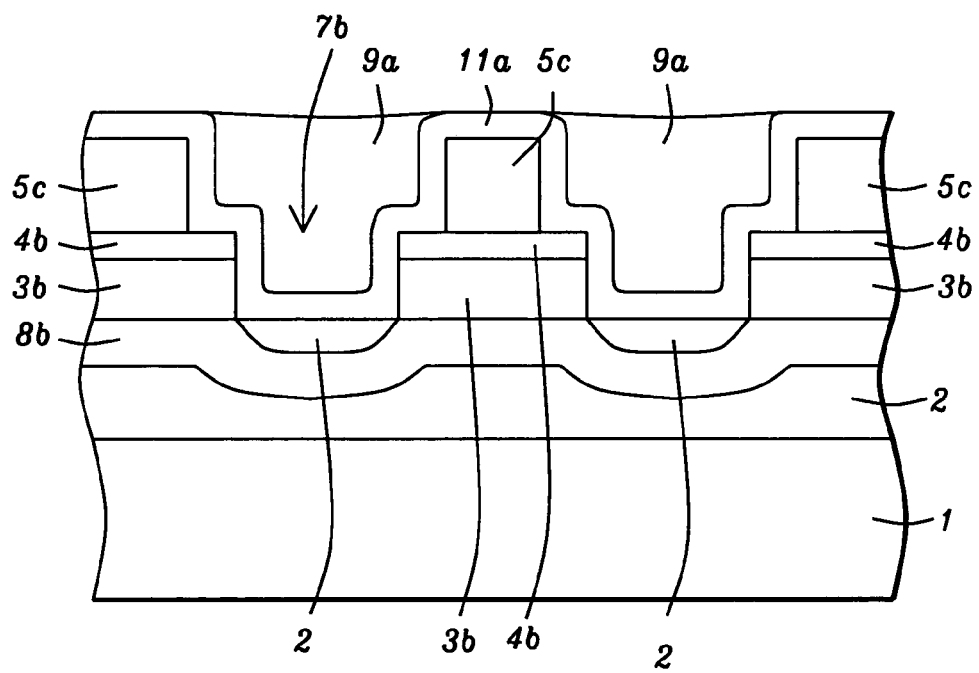
Figure 11:
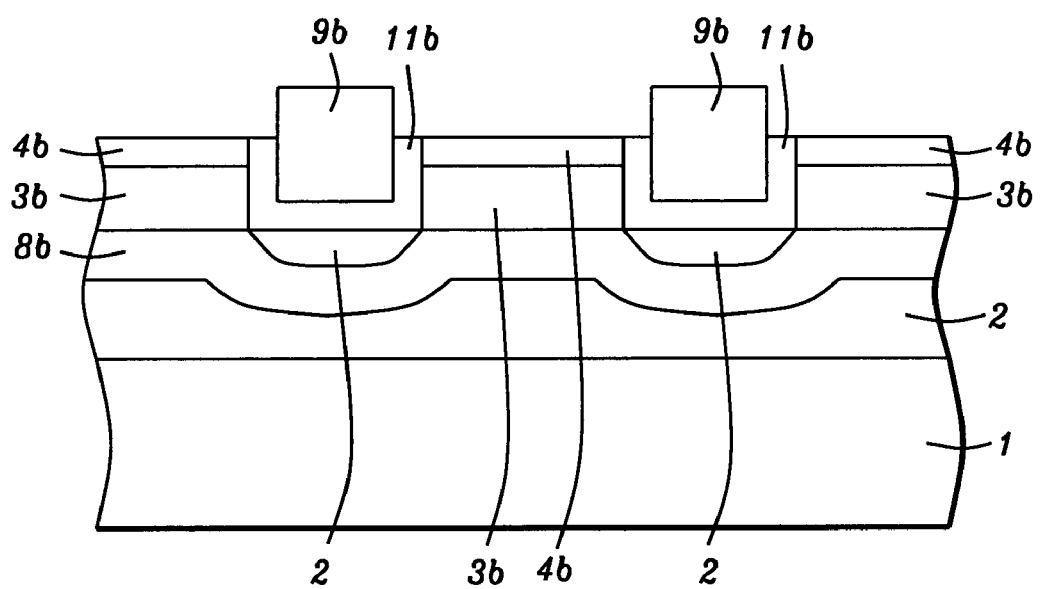

Silicon oxide layer 9a, again as described in the first embodiment of this invention, is employed to completely fill STI openings 7b. A CMP procedure is used for planarization purposes selectively removing portions of silicon oxide layer 9a, from the top surface of layer 11a, in locations in which layer 11a, overlaid silicon nitride shapes 5c. This is schematically shown in FIG. 10.

Selective removal of layer 11a, as well as silicon nitride shapes 5c, is next accomplished via wet etch procedures featuring use of a hot phosphorous acid solution. The resulting structure now featuring silicon oxynitride or composite insulator liners 11b, is now prepared for NMOS device processing, such as threshold adjust implantations, gate insulator formation, conductive gate structure definition, insulator sidewall spacer formation, source/drain formation, and metal silicide formation. These procedure can now be performed with a reduced risk of boron loss from the NMOS channel region to adjacent insulator regions via use of underlying buried oxide region 8b, and with a reduced risk of boron loss to the insulator filled STI regions via the use of the STI liner structures.

While this invention has been particularly shown and described with reference to, the preferred embodiments thereof, it will be understood by those skilled in the art that various changes in form and details may be made without departing from the spirit and scope of this invention.

What is claimed is:

1. A method of reducing boron segregation phenomena in an N channel, metal oxide semiconductor (NMOS) device via formation of a doped insulator region formed in an underlying insulator layer, comprising the steps of:
    forming a semiconductor layer on an underlying insulator layer, wherein said insulator overlays a semiconductor substrate;
    forming a hard mask layer on said semiconductor layer;
    defining openings in said hard mask layer and in said semiconductor layer exposing a portion of said insulator layer and creating composite stacks comprised of hard mask shapes on semiconductor shapes;
    laterally removing portions of said hard mask shapes exposing top portions of edges of said semiconductor shapes;
    performing an ion implantation procedure to place ions in portions of said insulator layer exposed in said openings, and to place ions in portions of said insulator layer underlying portions of said semiconductor shapes;
    performing an anneal procedure to activate said ions and forming said doped insulator region in portions of said insulator layer;
    filling said openings with a second insulator layer; and
    removing said hard mask shapes.

2. The method of claim 1, wherein said semiconductor layer is a silicon layer obtained at a thickness between about 10 to 1000 Angstroms, via SOI formation procedures.

3. The method of claim 1, wherein said insulator layer is comprised of silicon oxide formed at a thickness between about 50 to 5000 Angstroms.

4. The method of claim 1, wherein said hard mask layer is a silicon nitride layer, obtained via LPCVD or via PECVD procedures, at a thickness between about 100 to 1500 Angstroms.

5. The method of claim 1, wherein said openings in said hard mask layer and in said semiconductor layer are accomplished via an anisotropic RIE procedure.

6. The method of claim 1, wherein the width of said composite stacks comprised of hard mask shapes on semiconductor shapes, is between about 0.05 to 10 um.

7. The method of claim 1, wherein lateral pull back of said hard mask shapes, is accomplished via an isotopic wet etch procedure performed using $H_3Po_4$ or $H_2Po_3$ as an etchant for said hard mask shape.

8. The method of claim 1, wherein the length of lateral pull back of said hard mask shape is between about 10 to 500 Angstroms.

9. The method of claim 1, wherein said ion implantation procedure is performed using boron ions at an energy between about 1 to 10 KeV, at a dose between about 1E12 to 1E16 atoms/cm$^2$, and featuring an implantation angle between about 0 to 45°.

10. The method of claim 1, wherein said ion implantation procedure is performed using nitrogen ions at an energy between about 1 to 10 KeV, at a dose between about 1E12to 1E16atoms/cm$^2$, and featuring an implantation angle between about 0to 45°.

11. The method of claim 1, wherein said anneal procedure is performed in hydrogen at a temperature between 800 to 1100° C. for a time between about 10 sec to 15 mm, at a pressure between about 10 to 1000 torr.

12. The method of claim 1, wherein said doped insulator region is either a boron doped insulator region, a nitrogen doped insulator region, or a boron and nitrogen doped region.

13. The method of claim 1, wherein said doped insulator region includes a boron and nitrogen doped region that has a nitrogen profile is located beneath a boron profile.

14. The method of claim 1, wherein said second insulator layer is a silicon oxide layer obtained via LPCVD, PECVD, HDPCVD, or SACVD procedures, at a thickness between about 100 to 5000 Angstroms.

15. The method of claim 1, including after said performing of said anneal procedure and before said filling of said openings, forming a dielectric barrier layer on exposed surfaces within said openings.

16. The method of claim 15, wherein dielectric barrier layer includes a nitrogen containing layer with a thickness between about 10 to 1000 Angstroms.

17. The method of claim 15, wherein said dielectric barrier layer is a composite layer that includes an overlying silicon nitride layer with a thickness between about 10 to 100 Angstroms, and an underlying silicon oxide layer with a thickness between about 10 to 100 Angstroms.

18. A method of reducing a boron segregation phenomena in an N channel, metal oxide semiconductor (NMOS) device via formation of doped insulator regions in an underlying insulator layer, and via formation of a dielectric barrier layer surrounding insulator filled shallow trench shapes, comprising the steps of:
    forming a silicon on insulator (SOI) layer wherein an insulator component of said SOI layer is comprised of silicon oxide, located on a semiconductor substrate;
    forming a silicon nitride layer on said silicon layer;
    performing an anisotropic dry etch procedure to form shallow trench isolation (STI) openings in said silicon nitride layer and in said silicon layer exposing a portion of said insulator layer, with unetched portions resulting in composite stacks comprised of silicon nitride shapes on silicon shapes;
    performing an isotropic etch procedure to laterally remove portions of said silicon nitride shapes exposing edges of top portions of said silicon shapes;
    performing an ion implantation procedure to place ions in portions of said insulator layer exposed in said STI openings, and to place ions in portions of said insulator layer underlying portions of said silicon shapes;
    performing a hydrogen anneal procedure to activate said ions and to form said doped insulator region in portions of said insulator layer;

forming said dielectric barrier layer on exposed surfaces of said STI openings and on portions of said insulator layer exposed at bottom of said STI openings;

depositing a silicon oxide layer completely filling said STI openings;

performing a planarization procedure to form silicon oxide filled STI regions; and removing said silicon nitride shapes.

19. The method of claim 18, wherein said silicon layer of said SOI layer is obtained at a thickness between about 10 to 1000 Angstroms.

20. The method of claim 18, wherein said insulator component of said SOI layer is comprised of silicon oxide at a thickness between about 50 to 5000 Angstroms.

21. The method of claim 18, wherein said silicon nitride layer is obtained via LPCVD or via PECVD procedures, at a thickness between about 100 to 1500 Angstroms.

22. The method of claim 18, wherein the width of said composite stacks comprised of silicon nitride shapes on silicon shapes, is between about 0.05 to 10 um.

23. The method of claim 18, wherein said isotropic etch used to laterally remove portions of said silicon nitride shapes is an isotropic wet etch procedure performed using $H_3PO_4$ or $H_2PO_3$ as an etchant for silicon nitride.

24. The method of claim 18, wherein the length of lateral pull back of said silicon nitride shape is between about 10 to 500 Angstroms.

25. The method of claim 18, wherein said ion implantation procedure is performed using boron ions at an energy between about 1 to 10 KeV, at a dose between about 1E12 to 1E16 atoms/cm$^2$, and featuring an implantation angle between about 0 to 45°.

26. The method of claim 18, wherein said ion implantation procedure is performed using nitrogen ions at an energy between about 1 to 10 KeV, at a dose between about 1E12 to 1E16 atoms/cm$^2$, and featuring an implantation angle between about 0 to 45°.

27. The method of claim 18, wherein said anneal procedure is performed in hydrogen at a temperature between 800 to 1100°, for a time between about 10 sec to 15 min, at a pressure between about 10 to 1000 torr.

28. The method of claim 18, wherein dielectric barrier layer is comprised of a nitrogen containing layer, at a thickness between about 10 to 1000 Angstroms.

29. The method of claim 18, wherein said dielectric barrier layer is a composite layer comprised of an overlying silicon nitride layer at a thickness between about 10 to 100 Angstroms, and of an underlying silicon oxide layer at a thickness between about 10 to 100 Angstroms.

* * * * *